(12) United States Patent
Jang et al.

(10) Patent No.: US 8,493,115 B2
(45) Date of Patent: Jul. 23, 2013

(54) PHASE LOCKED LOOP CIRCUIT AND SYSTEM HAVING THE SAME

(75) Inventors: Tae-Kwang Jang, Seoul (KR); Jae-Jin Park, Seongnam-si (KR); Ji-Hyun Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 208 days.

(21) Appl. No.: 13/050,445

(22) Filed: Mar. 17, 2011

(65) Prior Publication Data
US 2011/0227617 A1    Sep. 22, 2011

(30) Foreign Application Priority Data
Mar. 18, 2010 (KR) ........................ 10-2010-0024403

(51) Int. Cl.
*H03L 7/06* (2006.01)
(52) U.S. Cl.
USPC .......................... 327/157; 375/376; 327/159
(58) Field of Classification Search
USPC .......................................... 327/157; 375/376
See application file for complete search history.

(56) References Cited

U.S. PATENT DOCUMENTS

| | | | |
|---|---|---|---|
| 5,659,588 A * | 8/1997 | Fiedler | 375/376 |
| 7,116,177 B2 | 10/2006 | Brekelmans et al. | |
| 7,183,862 B2 | 2/2007 | Takase | |
| 7,248,086 B2 * | 7/2007 | Frans et al. | 327/147 |
| 7,742,554 B2 * | 6/2010 | Huang et al. | 375/376 |
| 7,786,810 B2 * | 8/2010 | Liu et al. | 331/17 |
| 2008/0009284 A1 * | 1/2008 | Zhang et al. | 455/435.1 |
| 2010/0001771 A1 * | 1/2010 | Liu et al. | 327/157 |

FOREIGN PATENT DOCUMENTS

| | | |
|---|---|---|
| JP | 2005-528034 | 9/2005 |
| JP | 2006-345512 | 12/2006 |
| JP | 2007-184778 | 7/2007 |

* cited by examiner

*Primary Examiner* — Ryan Jager
(74) *Attorney, Agent, or Firm* — Lee & Morse, P.C.

(57) ABSTRACT

A phase locked loop (PLL) circuit and a system including such a PLL that may at least compensate for leakage current in a loop filter. The PLL circuit may include a voltage adjusting unit configured to pump charges based on a phase difference between an oscillation clock signal and a reference clock signal, a loop filter configured to generate a frequency control voltage, a level of which is shifted by the charge pumping of the voltage adjusting unit, a voltage controlled oscillator (VCO) configured to output the oscillation clock signal having a frequency corresponding to the frequency control voltage, and a current control circuit configured to generate a compensation current corresponding to a leakage current generated by the loop filter and allow the compensation current and the leakage current to substantially and/or completely counterbalance each other.

16 Claims, 5 Drawing Sheets

PHASE LOCKED LOOP CIRCUIT AND SYSTEM HAVING THE SAME

CROSS-REFERENCE TO RELATED APPLICATION

This application claims priority under 35 U.S.C. §119 to Korean Patent Application No. 10-2010-0024403 filed on Mar. 18, 2010, the disclosure of which is hereby incorporated by reference in its entirety.

BACKGROUND

1. Field

Embodiments of the inventive concept relate to a phase locked loop (PLL) circuit configured to compensate for variations in oscillation frequency as a result of, e.g., leakage current, so as to maintain the oscillation frequency at a constant level, and a system having such a PLL circuit.

2. Description of the Related Art

A phase locked loop (PLL) circuit, which is a typical basic circuit employed in electronic systems, may generate an output clock signal having a desired frequency and may transmit the output clock signal to internal circuits. A PLL circuit may be included in various circuits configured to operate in synchronization with a clock signal. The PLL circuit may continuously compare a phase of the output clock signal with a phase of a reference clock signal to adjust a frequency of the output clock signal. So, the output clock signal can maintain a predetermined frequency.

SUMMARY

One or more embodiments of the inventive concept may provide a phase locked loop (PLL) circuit capable of preventing and/or reducing a variation in oscillation frequency due to a leakage current of a loop filter.

One or more embodiments of the inventive concept may provide a system including such a PLL circuit.

One or more embodiments may provide a phase locked loop (PLL) circuit, including a voltage adjusting unit configured to pump charges based on a phase difference between an oscillation clock signal and a reference clock signal, a loop filter configured to generate a frequency control voltage, a level of which is shifted by the charge pumping of the voltage adjusting unit, a voltage controlled oscillator (VCO) configured to output the oscillation clock signal having a frequency corresponding to the frequency control voltage, and a current control circuit configured to generate a compensation current corresponding to a leakage current generated by the loop filter and allow the compensation current and the leakage current to counterbalance each other.

The leakage current and the compensation current may shift the level of the frequency control voltage in opposite directions.

The loop filter may include a first MOS capacitor and a resistor connected in series between a power supply voltage terminal and an output terminal of the voltage adjusting unit, and a capacitor connected in parallel to the first MOS capacitor and the resistor and configured to accumulate or emit charges depending on the charge pumping of the voltage adjusting unit and control the level of the frequency control voltage.

The current control circuit may include a current generator including a current mirror circuit including first and second current paths and configured to control an inflow amount of the compensation current of the second current path according to a control current supplied from a second MOS capacitor to the first current path, wherein one side of the first current path is connected to the second MOS capacitor, and one side of the second current path is connected to a node between the first MOS capacitor and the resistor, and a voltage controller configured to compare a path voltage, which varies with the control current, with a reference voltage and output a current control voltage used for controlling the control current based on the comparison result.

As the path voltage becomes closer to the reference voltage, the compensation current may become closer to a leakage current of the first MOS capacitor.

The current control circuit may further include a voltage generator configured to generate the reference voltage.

The voltage generator may set the reference voltage to a voltage level of the node between the first MOS capacitor and the resistor or a voltage level of the frequency control voltage.

The current generator may include a first switching device connected between the first MOS capacitor and a ground terminal and configured to the control current of the second current path, and a second switching device connected between the second MOS capacitor and the ground terminal and configured to control the control current of the first current path in response to the current control voltage.

A ratio of a width to length ratio of the first MOS capacitor and the first switching device to a width to length ratio of the second MOS capacitor and the second switching device may be set to a predetermined value.

The voltage controller may receive a voltage of the node between the first MOS capacitor and the resistor or the frequency control voltage and uses the received voltage as the reference voltage.

The voltage controller may include a differential amplifier configured to differentially amplify the reference voltage and the path voltage.

One or more embodiments may provide a system, including a phase locked loop (PLL) circuit configured to output an oscillation clock signal having a predetermined frequency in synchronization with a reference clock signal, the PLL circuit including a loop filter configured to generate a frequency control voltage, a voltage level of which is controlled based on a phase difference between the reference clock signal and the oscillation clock signal, a voltage-controlled oscillator (VCO) configured to output the oscillation clock signal having a frequency corresponding to the frequency control voltage, and a current control circuit configured to generate a compensation current corresponding to a leakage current generated by the loop filter and allow the compensation current and the leakage current to counterbalance each other, and an internal circuit configured to perform an internal operation in synchronization with the oscillation clock signal.

The leakage current and the compensation current may shift a level of the frequency control voltage in opposite directions.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
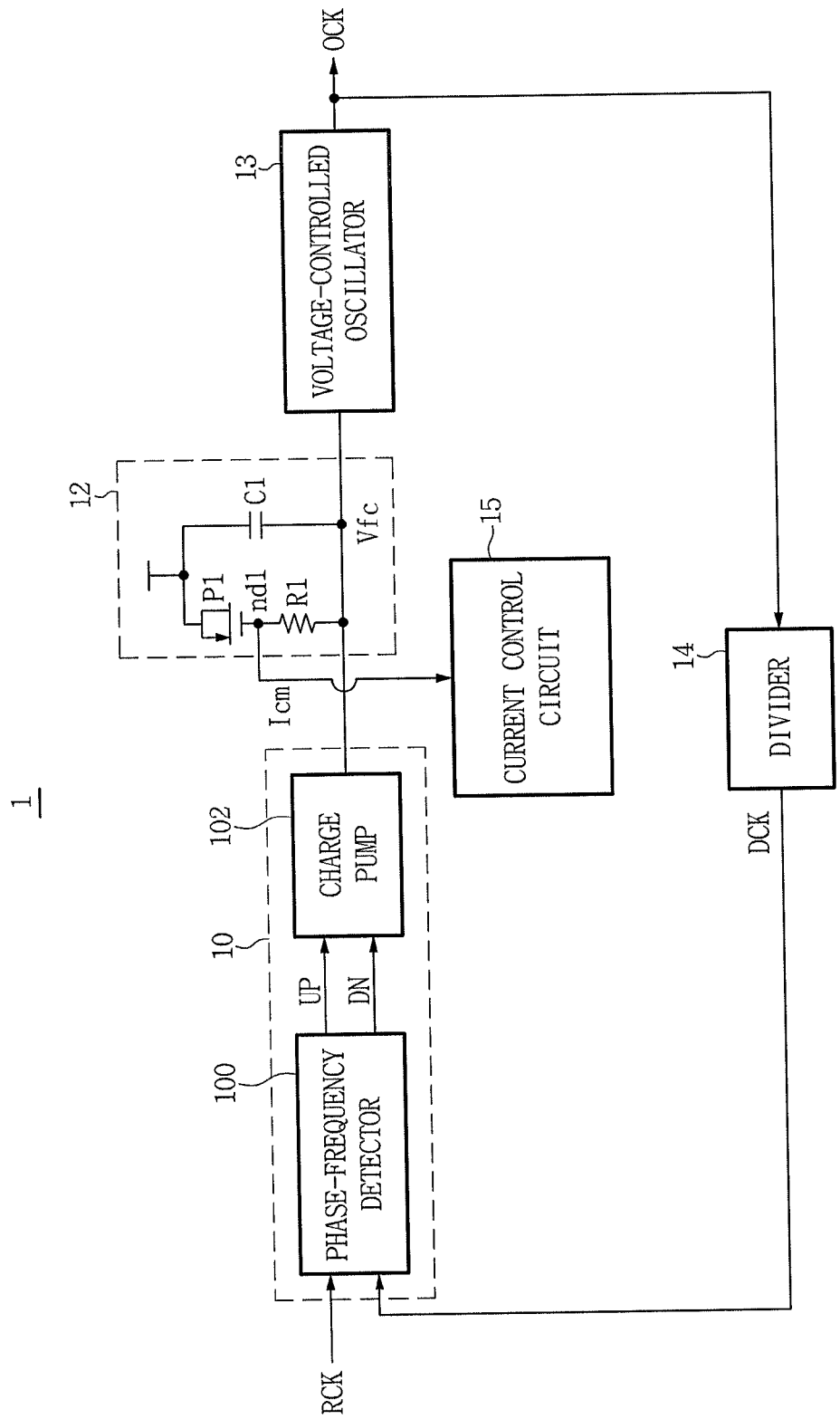
FIG. 1 illustrates a block diagram of an exemplary embodiment of a phase locked loop (PLL) circuit.

Exemplary embodiments of the inventive concept are provided only for structural and functional descriptions of the inventive concept, the inventive concept should not be construed as limited to the embodiments set forth herein. Thus, it will be clearly understood by those skilled in the art that the embodiments of the inventive concept may be embodied in different forms and include all variations, equivalents, and substitutes that can realize the spirit of the inventive concept.

The terminology used herein should be understood as follows.

It will be understood that, although the terms first, second, etc. may be used herein to describe various elements, these elements should not be limited by these terms. These terms are only used to distinguish one element from another element. Thus, a first element discussed below could be termed a second element, etc., without departing from the teachings of the inventive concept.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Meanwhile, spatially relative terms, such as "between" and the like, which are used herein for ease of description to describe one element or feature's relationship to another element(s) or feature(s) as illustrated in the figures, should be interpreted similarly.

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Unless expressly defined in a specific order herein, respective steps described in the inventive concept may be performed otherwise. That is, the respective steps may be performed in a specified order, substantially at the same time, or in reverse order.

Hereinafter, embodiments of a phase-locked loop (PLL) circuit and a system including the same will be described with reference to the appended drawings.

FIG. 1 illustrates a block diagram of an exemplary embodiment of a phase locked loop (PLL) circuit 1.

Referring to FIG. 1, the PLL circuit 1 may include a voltage adjusting unit 10, a loop filter 12, a voltage controlled oscillator (VCO) 13, a divider 14, and a current control circuit 15. The voltage adjusting unit 10 may include a phase-frequency detector (PFD) 100 and a charge pump 102.

Exemplary operations of respective blocks of the PLL circuit 1 including the above-described exemplary configuration will now be described.

The voltage adjusting unit 10 may adjust a voltage level of a frequency control voltage Vfc based on a phase difference between a reference clock signal RCK and an oscillation clock signal OCK. The PFD 100 of the voltage adjusting unit 10 may output an up signal UP and a down signal DN, which may differ in pulse width from each other, based on the phase difference between the reference clock signal RCK and the oscillation clock signal OCK. For example, the PFD 100 may output the up signal UP having a pulse width corresponding to the phase difference between the reference clock signal RCK and the oscillation clock signal OCK when the phase of the reference clock signal RCK leads that of the oscillation clock signal OCK. The PFD 100 may output the output the down signal DN having a pulse width corresponding to the phase difference between the reference clock signal RCK and the oscillation clock signal OCK when the phase of the oscillation clock signal OCK leads that of the reference clock signal RCK.

The charge pump 102 of the voltage adjusting unit 10 may include a circuit configured to convert a pulse width of the up signal UP or the down signal DN into a predetermined analog voltage and supply or consume charges in response to the up signal UP or the down signal DN. The charge pump 102 may be interlocked with the loop filter 12. For example, the charge pump 102 may supply charges corresponding to the pulse width of an up signal UP or consume charges corresponding to the pulse width of a down signal DN. Thus, charges may be accumulated in or emitted from a capacitor C included in the loop filter 12, and may thereby shift the level of the frequency control voltage Vfc.

The loop filter 12 may be a low-pass filter (LPF). The loop filter 12 may include an PMOS transistor P1, a resistor R1, and a capacitor C1. The PMOS transistor P1 and the resistor R1 may be connected in series between a power supply voltage terminal and the output terminal of the voltage adjusting unit 10. The capacitor C1 may be connected in parallel to the PMOS transistor P1 and the resistor R1. The PMOS transistor P1 may include source and drain terminals, which may be connected to each other, and may function as a MOS capacitor. The PMOS transistor P1 and the resistor R1 may serve as an LPF configured to filter out some components and selectively retain components, e.g., filter out unnecessary components other than a direct-current (DC) component.

In view of a frequency region, the PFD 100 may be highly similar to a mixer in that the PFD 100 may output a value corresponding to a difference between two input frequencies.

Thus, like the mixer, the output of the PFD 100 may include various frequency components including harmonic components. Accordingly, the PLL circuit may filter unnecessary frequency components using the loop filter 12. That is, the loop filter 12 may smooth a frequency control voltage Vfc, remove noise from the smoothed frequency control voltage Vfc, and transmit the noise-removed frequency control voltage Vfc to the VCO 13.

The VCO 13 may output an oscillation clock signal OCK having a frequency corresponding to a voltage level of the frequency control voltage Vfc.

The divider 14 may divide a high-frequency oscillation clock signal OCK and generate division clock signals DCK having a low frequency. Assuming, e.g., that the reference clock signal RCK has a low frequency, the PLL circuit 1 may divide the oscillation clock signal OCK into the division clock signals DCK having the low frequency to compare the oscillation clock signal OCK with the reference clock signal RCK.

The current control circuit 15 may generate a compensation current Icm corresponding to a leakage current generated by the loop filter 12. The current control circuit 15 may allow the compensation current and the leakage current to counterbalance each other. When a leakage current occurs in the PMOS transistor P1 used as a MOS capacitor in the loop filter 12, the leakage current may lead to a variation in a voltage of a node nd1 of the loop filter 12 and/or to a variation in a voltage level in the frequency control voltage Vfc. In embodiments, the current control circuit 15 may receive the compensation current Icm corresponding to the leakage current generated in the loop filter 12 from the loop filter 12 and may maintain the frequency control voltage Vfc at a constant level despite the leakage current.

Figure 2:
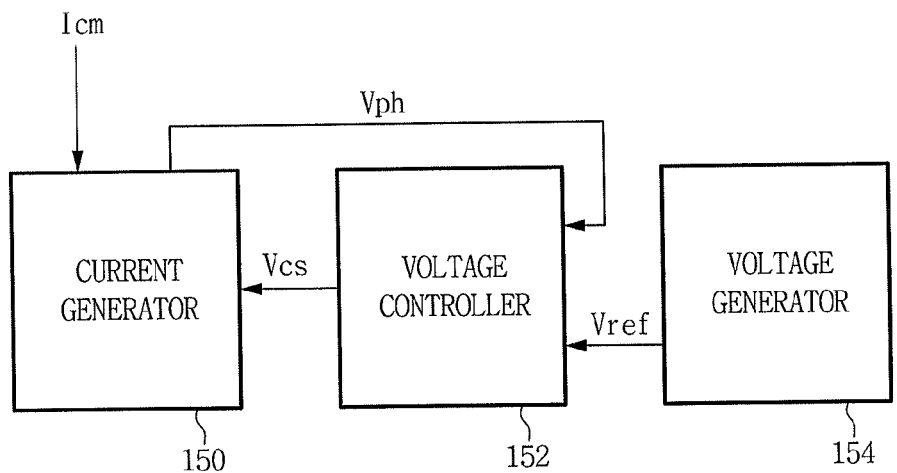
FIG. 2 illustrates a block diagram of an exemplary embodiment of a current control circuit employable by the PLL circuit of FIG. 1.
Figure 3:
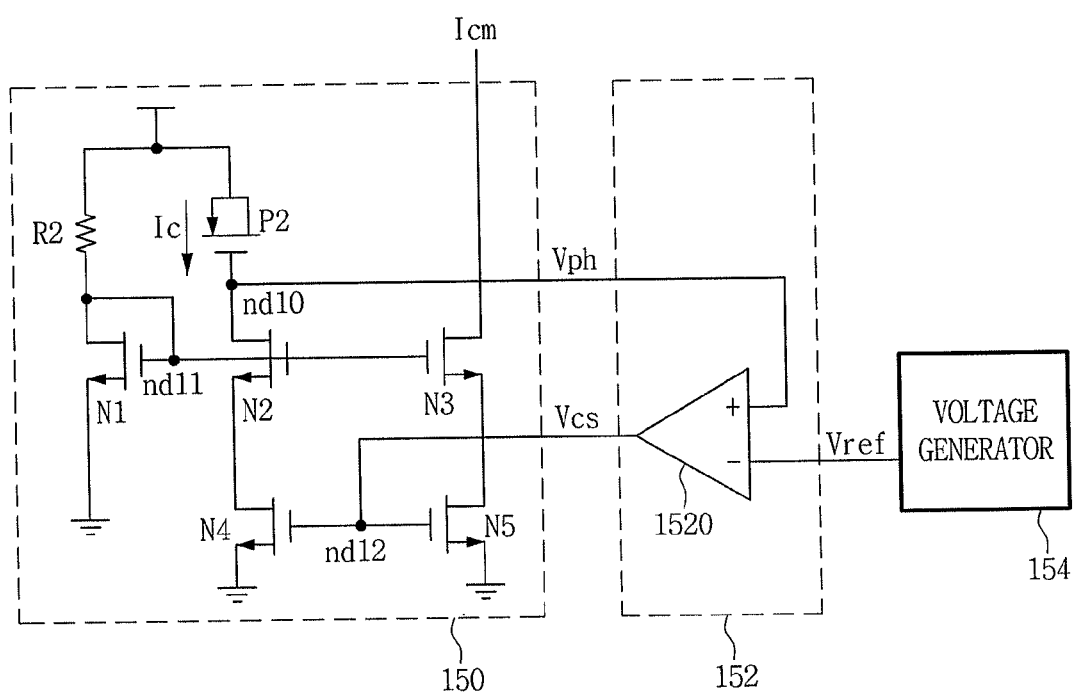
FIG. 3 illustrates a circuit diagram of an exemplary embodiment of an internal configuration of the current control circuit of FIG. 2.

FIG. 2 illustrates a block diagram of an exemplary embodiment of the current control circuit 15 employable by the PLL circuit 1 of FIG. 1. FIG. 3 illustrates a circuit diagram of an exemplary embodiment of an internal configuration of the current control circuit 15 of FIG. 2

Referring to FIGS. 2 and 3, the current control circuit 15 may include a current generator 150, a voltage controller 152, and a voltage generator 154.

Exemplary functions of the respective blocks of the above-described current control circuit 15 will now be described.

The current generator 150 may include a current mirror circuit including a first current path and a second current path. The first current path may be provided between a PMOS transistor P2 and a ground terminal. The second current path may be provided between a PMOS transistor P1, e.g., node nd1, of the loop filter 12 and the ground terminal. One side of the second current path may be connected to the node nd1 disposed between the resistor R1 and the MOS capacitor including the PMOS transistor P1. One side of the first current path may be connected to a MOS capacitor including the PMOS transistor P2. The PMOS transistor P2 of the first current path may be included in the MOS capacitor, and may provide the same environmental conditions as the loop filter 12 to generate a leakage current. Hereinafter, the MOS capacitor including the PMOS transistor P2 will be referred to as a first MOS capacitor, and the MOS capacitor including the PMOS transistor P1 will be referred to as a second MOS capacitor. The first MOS capacitor may be connected between the power supply voltage terminal and a node nd10.

In embodiments, a width to length ratio W/L of the PMOS transistor P2 and an NMOS transistor N4 of the first current path may be fabricated to be 1/K times of a width to length ratio W/L of the PMOS transistor P1 and the NMOS transistor N5 of the second current path. In such cases, when a same voltage is applied to the first and second current paths, current supplied to the second current path may be K times the current supplied to the first current path. Embodiments are not limited thereto. For example, in some embodiments, a width to length ratio W/L of the PMOS transistor P2 and the NMOS transistor N4 of the first current path may be fabricated to be the same as the width to length ratio W/L of the PMOS transistor P1 and the NMOS transistor N5 of the second current path.

The current generator 150 having the above configuration may control an amount of the compensation current km based on a control current Ic of the first current path. Further, by equalizing a voltage applied to the first current path and a voltage applied to the second current path, the compensation current Icm may equal the leakage current of the second MOS capacitor of the loop filter 12. In embodiments, the voltage controller 152 may equalize the voltage applied to the first current path to a voltage applied to the second current path so as to enable generation of the compensation current Icm corresponding to the leakage current of the second MOS capacitor of the loop filter 12.

More particularly, e.g., the voltage controller 152 may compare a path voltage Vph of the first current path of the current generator 150 with a reference voltage Vref generated by the voltage generator 154 and may control the control current Ic of the first current path such that the path voltage Vph reaches a voltage level of the reference voltage Vref. In this case, the reference voltage Vref may be set to a voltage level of the node nd1 of the loop filter 12 or a voltage level of the frequency control voltage Vfc. Embodiments are not limited thereto. For example, the reference voltage Vref may be set to another voltage level. Thus, a compensation current Icm supplied to the current generator 150 may become equal to a leakage current of a second MOS capacitor of the loop filter 12. The voltage controller 152 may include a differential amplifier 1520 configured to differentially amplify the path voltage Vph and the reference voltage Vref.

Exemplary operation of the current control circuit 15 will now be described with reference to FIGS. 1 through 3.

The path voltage Vph of the current generator 150 may be equalized to the voltage of the node nd1 of the loop filter 12 so that the current generator 150 can receive the compensation current Icm corresponding to the leakage current of the loop filter 12 through the second current path.

For example, assuming that the width to length ratio W/L of the second MOS capacitor is fabricated to be 10 times of the width to length ratio W/L of the first MOS capacitor and the path voltage Vph is equal to the voltage of the node nd1, when the first MOS capacitor has a leakage current of about 10 µA, the second MOS capacitor may have a leakage current of about 100 µA. Also, a control current Ic of about 10 µA may flow through the first current path, and a compensation current Icm of about 100 µA may flow through the second current path. However, when the path voltage Vph differs from the voltage of the node nd1, the leakage current of the second MOS capacitor may become different from the compensation current Icm. Assuming that the path voltage Vph is lower than the voltage of the node nd1, even if the leakage current of the second MOS capacitor becomes about 100 µA, the first MOS capacitor may have a leakage current of less than 10 µA, and the control current Ic may also be less than 10 µA. As a result, the compensation current Icm of the second current path may be less than 100 µA to based on a ratio of the compensation current Icm of the second current path to the control current Ic of the first current path, so the leakage current of the second MOS capacitor may not be equal to the compensation current Icm.

The voltage controller 152 may differentially amplify the path voltage Vph and the reference voltage Vref and output a current control voltage Vcs. NMOS transistors N4 and N5 of the current generator 150 may control the current amounts of the first and second current paths in response to the current control voltage Vcs to control the voltage level of the path voltage Vph. The above-described process may be repeated so that the path voltage Vph may approximate the reference voltage Vref.

The current generator 150 may generate the compensation current Icm and supply the compensation current Icm to the second current path based on the control current Ic of the first current path. In this case, as the path voltage Vph approximates the reference voltage Vref, the compensation current Icm controlled by the control current Ic may come closer to the leakage current of the second MOS capacitor of the loop filter 12. When the path voltage Vph applied to the first MOS capacitor becomes equal to the reference voltage Vref, the compensation current Icm supplied from the loop filter 12 to the second current path of the current generator 150 may become the leakage current of the second MOS capacitor of the loop filter 12. The leakage current of the second MOS capacitor may function to boost the voltage level of the frequency control voltage Vfc, and the compensation current Icm, which may be equal to the leakage current, may function to drop the voltage level of the frequency control voltage Vfc. Thus, effects of the leakage current and the compensation current Icm may substantially and/or completely counterbalance each other, and may thereby reduce and/or prevent a level variation in the frequency control voltage Vfc due to the leakage current.

One or more embodiments of the PLL circuit 1 may generate the compensation current Icm to reduce and/or prevent a level variation in the frequency control voltage Vfc due to the leakage current of the loop filter 12. In such embodiments, the compensation current Icm may be equal to the leakage current of the second MOS capacitor P1. Therefore, in one or more embodiments, the frequency control voltage Vfc may be maintained at a constant level even with the occurrence of the leakage current.

Figure 4:
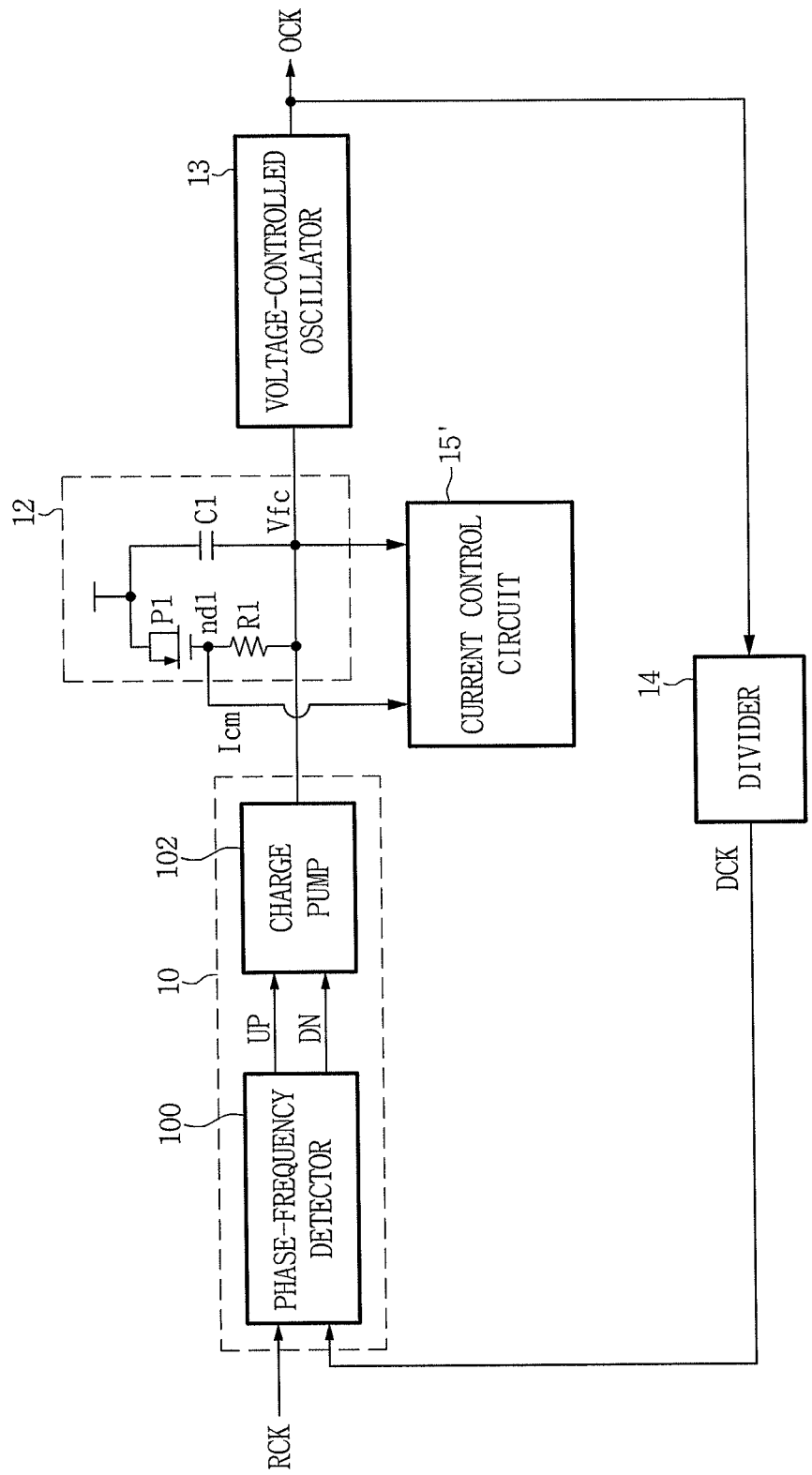
FIG. 4 illustrates a block diagram of another exemplary embodiment of a PLL circuit.
Figure 5:
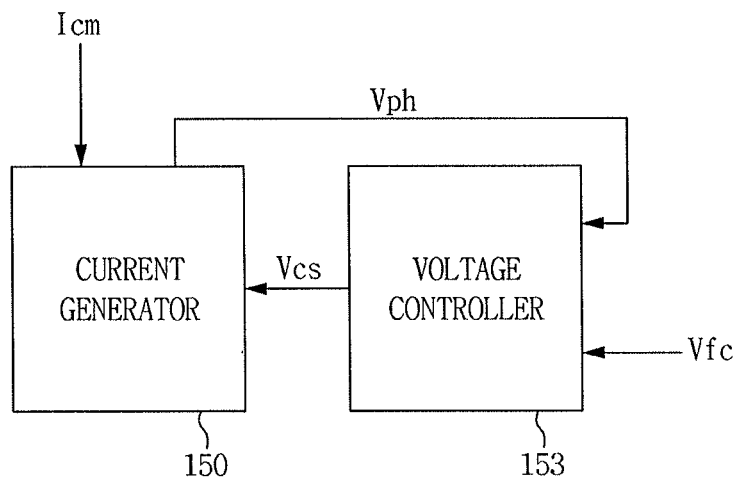
FIG. 5 illustrates a block diagram of an exemplary embodiment of a current control circuit employable by the PLL circuit of FIG. 4.
Figure 6:
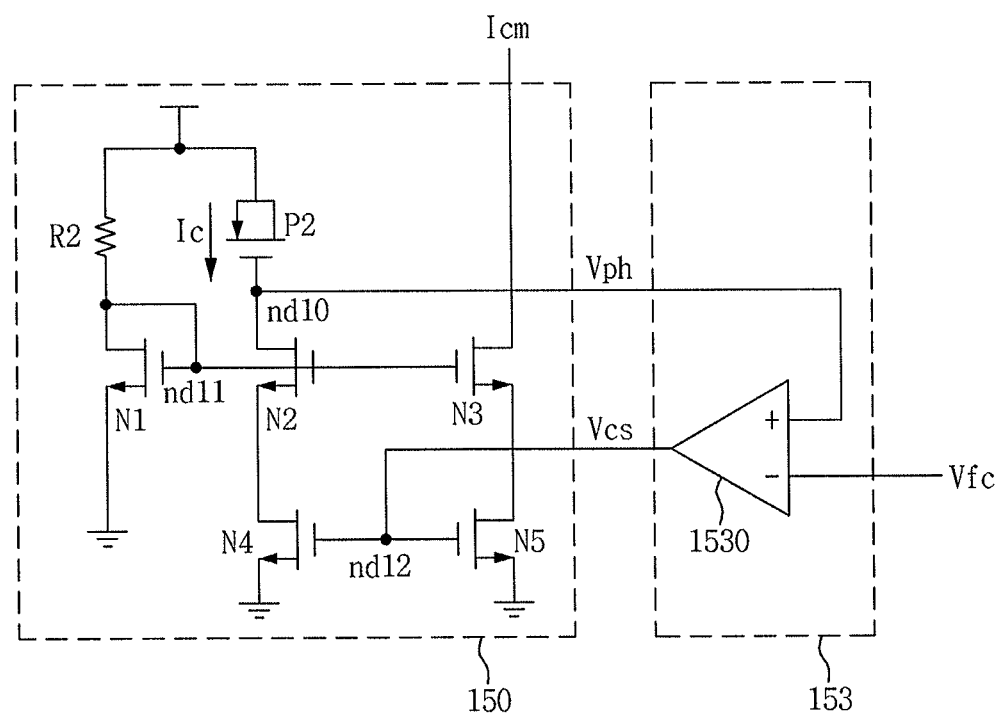
FIG. 6 illustrates a circuit diagram of an exemplary embodiment of an internal configuration of the current control circuit of FIG. 5.

FIG. 4 illustrates a block diagram of another exemplary embodiment of a PLL circuit 1'. FIG. 5 illustrates a block diagram of an exemplary embodiment of a current control circuit 15' employable by the PLL circuit 1' of FIG. 4. FIG. 6 illustrates a circuit diagram of an exemplary embodiment of an internal configuration of the current control circuit 15' of FIG. 5.

In general, only differences between the exemplary PLL circuit 1' of FIG. 4 and the exemplary PLL circuit 1 of FIG. 1 will be described below. More particularly, in general, only differences between the exemplary current control circuit 15' of FIGS. 5 and 6 and the exemplary current control circuit 15 of FIGS. 2 and 3 will be described below.

Referring to FIG. 4, the PLL circuit 1' may include the voltage adjusting unit 10 including the PFD 100 and the charge pump 102, the loop filter 12, the VCO 13, the divider 14, and the current control circuit 15'. Referring to FIGS. 5 and 6, the current control circuit 15' may include the current generator 150 and a voltage controller 153. The current control circuit 15' may not include the voltage generator 154 of FIG. 2 that may be configured to generate the reference voltage Vref. The current control circuit 15' may receive the frequency control voltage Vrc from the loop filter 12 and use the frequency control voltage Vrc as a reference voltage.

The current control circuit 15' may receive the frequency control voltage Vfc from the loop filter 12 and use the frequency control voltage Vfc as a reference voltage.

Exemplary operation of each of the blocks of the above-described current control circuit 15' of FIGS. 5 and 6 will now be described.

The voltage controller 153 may receive the frequency control voltage Vfc from the loop filter 12 and use the frequency control voltage Vfc as a reference voltage. The voltage controller 153 may control the control current Ic of the current generator 150 so that the path voltage Vph of the first current path of the current generator 150 reaches a voltage level of the frequency control voltage Vfc. The voltage controller 153 may receive the voltage of the node nd1 instead of the frequency control voltage Vfc and use the voltage of the node nd1 as a reference voltage because the frequency control voltage Vfc may become substantially and/or completely equal to the voltage of the node nd1 when a floating state is provided between the loop filter 12 and the VCO 13.

As described above, the voltage controller 153 may substantially and/or completely equalize the path voltage Vph applied to the first MOS capacitor to a voltage applied to the second MOS capacitor. Thus, the compensation current Icm supplied to the current generator 150 may become substantially and/or completely equal to a leakage current of the second MOS capacitor of the loop filter 12. The voltage controller 153 may include a differential amplifier 1530 configured to differentially amplify the path voltage Vph and the frequency control voltage Vfc.

Exemplary operation of the current control circuit 15' will now be described with reference to FIGS. 4 through 6.

The voltage controller 153 may differentially amplify the path voltage Vph applied to the first MOS capacitor of the current generator 150 and the frequency control voltage Vfc. The voltage controller 153 may output a current control voltage Vcs. NMOS transistors N4, N5 of the current generator 150 may control current amounts of the first and second current paths in response to the current control voltage Vcs to control a voltage level of the path voltage Vph. The above-described process may be repeated so that the path voltage Vph may approximate and/or equal the frequency control voltage Vfc.

The current generator 150 may generate a compensation current Icm and supply the compensation current Icm to the second current path based on a control current Ic. In such embodiments, as the path voltage Vph may approximate and/or equal the frequency control voltage Vfc, the compensation current Icm controlled by the control current Ic may become close to a leakage current of the second MOS capacitor of the loop filter 12. When the path voltage Vph is substantially and/or completely equalized to the frequency control voltage Vfc by the voltage controller 153, the compensation current Icm of the second current path may become substantially and/or completely equal to the leakage current of the second MOS capacitor of the loop filter 12. The leakage current of the second MOS capacitor may function to boost the voltage level of the frequency control voltage Vfc. The compensation current Icm, which may be substantially and/or completely equal to the leakage current, may function to drop the voltage level of the frequency control voltage Vfc. Thus, the effects of the leakage current and the compensation current Icm may substantially and/or completely counterbalance each other, and may thereby reduce and/or prevent a level variation in the frequency control voltage Vfc due to at least the leakage current.

One or more embodiments of a PLL circuit, e.g., 1, 1', may generate a compensation current Icm to reduce and/or prevent a level variation in a frequency control voltage Vfc due to at least a leakage current of a loop filter, e.g., loop filter 12, based on the frequency control voltage Vfc. One or more embodiments of a PLL circuit, e.g., 1, 1', may substantially and/or completely equalize the compensation current Icm to the leakage current so that the frequency control voltage Vfc may be maintained at a constant level even with the occurrence of leakage current.

Figure 7:
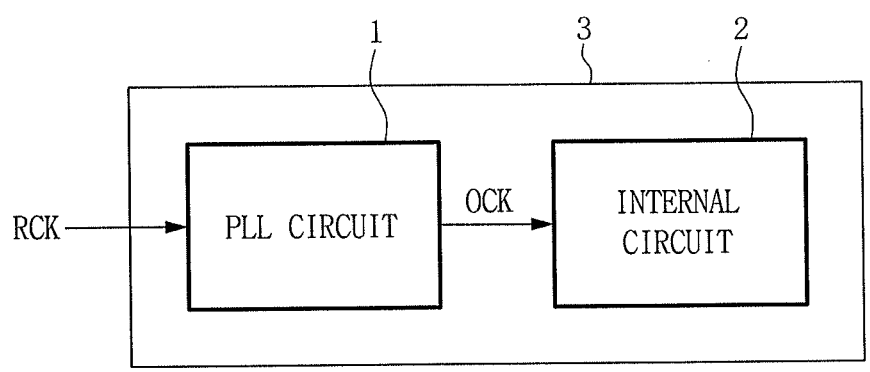
FIG. 7 illustrates a block diagram of an exemplary embodiment of a system including a PLL circuit including one or more features of the inventive concept.

FIG. 7 illustrates a block diagram of an example of a system 3 including a PLL circuit, e.g., 1, 1', including one or more features of the inventive concept.

Referring to FIG. 7, the system 3 may include the PLL circuit 1 and an internal circuit 2. In the following description, the PLL circuit 1 of FIG. 1 is employed for ease of description. Embodiments are not limited thereto as the system 3 may include, e.g., the PLL circuit 1' of FIG. 4.

The PLL circuit 1 may output an oscillation clock signal OCK having a predetermined frequency in synchronization with a reference clock signal RCK. The PLL circuit 1 may control a voltage level of a frequency control voltage Vfc used for controlling the frequency of the oscillation clock signal OCK based on a phase difference between the reference clock signal RCK and the oscillation clock signal OCK. The PLL circuit 1 may generate a compensation current corresponding to a leakage current generated therein to reduce and/or prevent a level variation in the frequency control voltage Vfc due to the leakage current. Thus, the PLL circuit 1 may output the oscillation clock signal OCK having a predetermined frequency. The PLL circuit 1 may reduce and/or prevent a variation in the frequency of the oscillation clock signal OCK despite occurrence of leakage current in the PLL circuit 1.

Meanwhile, the internal circuit 2 may perform an internal operation in synchronization with the oscillation clock signal OCK output by the PLL circuit 1.

The foregoing is illustrative of exemplary embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A phase locked loop (PLL) circuit, comprising:
    a voltage adjusting unit configured to pump charges based on a phase difference between an oscillation clock signal and a reference clock signal;
    a loop filter configured to generate a frequency control voltage, a level of which is shifted by the charge pumping of the voltage adjusting unit, the loop filter including:
        a first MOS capacitor and a resistor connected in series between a power supply voltage terminal and an output terminal of the voltage adjusting unit, and
        a capacitor connected in parallel to the first MOS capacitor and the resistor and configured to accumulate or emit charges depending on the charge pumping of the voltage adjusting unit and control the level of the frequency control voltage;
    a voltage controlled oscillator (VCO) configured to output the oscillation clock signal having a frequency corresponding to the frequency control voltage; and
    a current control circuit configured to generate a compensation current corresponding to a leakage current generated by the loop filter and allow the compensation current and the leakage current to counterbalance each other, the current control circuit including:
        a current generator including a current mirror circuit including first and second current paths and configured to control an inflow amount of the compensation current of the second current path according to a control current supplied from a second MOS capacitor to the first current path, wherein one side of the first current path is connected to the second MOS capacitor, and one side of the second current path is connected to a node between the first MOS capacitor and the resistor, and
        a voltage controller configured to compare a path voltage, which varies with the control current, with a reference voltage and output a current control voltage used for controlling the control current based on the comparison result.

2. The circuit as claimed in claim 1, wherein the leakage current and the compensation current shift the level of the frequency control voltage in opposite directions.

3. The circuit as claimed in claim 1, wherein, as the path voltage becomes closer to the reference voltage, the compensation current becomes closer to a leakage current of the first MOS capacitor.

4. The circuit as claimed in claim 1, wherein the current control circuit further comprises a voltage generator configured to generate the reference voltage.

5. The circuit as claimed in claim 4, wherein the voltage generator sets the reference voltage to a voltage level of the node between the first MOS capacitor and the resistor or a voltage level of the frequency control voltage.

6. The circuit as claimed in claim 1, wherein the current generator comprises:
    a first switching device connected between the first MOS capacitor and a ground terminal and configured to the control current of the second current path; and
    a second switching device connected between the second MOS capacitor and the ground terminal and configured to control the control current of the first current path in response to the current control voltage.

7. The circuit as claimed in claim 6, wherein a ratio of a width to length ratio of the first MOS capacitor and the first switching device to a width to length ratio of the second MOS capacitor and the second switching device is set to a predetermined value.

8. The circuit as claimed in claim 1, wherein the voltage controller receives a voltage of the node between the first MOS capacitor and the resistor or the frequency control voltage and uses the received voltage as the reference voltage.

9. The circuit as claimed in claim 1, wherein the voltage controller comprises a differential amplifier configured to differentially amplify the reference voltage and the path voltage.

10. A system, comprising:
    a phase locked loop (PLL) circuit configured to output an oscillation clock signal having a predetermined frequency in synchronization with a reference clock signal, the PLL circuit including
    a loop filter configured to generate a frequency control voltage, a voltage level of which is controlled based on a phase difference between the reference clock signal and the oscillation clock signal, the loop filter including:
        a first MOS capacitor and a resistor connected in series between a power supply voltage terminal and an output terminal of the voltage adjusting unit, and a capacitor connected in parallel to the first MOS capacitor and the resistor and configured to accumulate or emit charges depending on the charge pumping of the voltage adjusting unit and control the level of the frequency control voltage, a voltage-controlled oscillator (VCO) configured to output the oscillation clock signal having a frequency corresponding to the frequency control voltage, and a current control circuit configured to generate a compensation current corresponding to a leakage current generated by the loop filter and allow the compensation current and the leakage current to counterbalance each other, the current control circuit including:

a current generator including a current mirror circuit including first and second current paths and configured to control an inflow amount of the compensation current of the second current path according to a control current supplied from a second MOS capacitor to the first current path, wherein one side of the first current path is connected to the second MOS capacitor, and one side of the second current path is connected to a node between the first MOS capacitor and the resistor, and a voltage controller configured to compare a path voltage, which varies with the control current, with a reference voltage and output a current control voltage used for controlling the control current based on the comparison result; and an internal circuit configured to perform an internal operation in synchronization with the oscillation clock signal.

11. The system as claimed in claim 10, wherein the leakage current and the compensation current shift a level of the frequency control voltage in opposite directions.

12. The system as claimed in claim 10, wherein, as the path voltage becomes closer to the reference voltage, the compensation current becomes closer to a leakage current of the first MOS capacitor.

13. The system as claimed in claim 10, wherein the current control circuit further comprises a voltage generator configured to generate the reference voltage.

14. The system as claimed in claim 10, wherein the voltage generator sets the reference voltage to a voltage level of the node between the first MOS capacitor and the resistor or a voltage level of the frequency control voltage.

15. The system as claimed in claim 10, wherein the current generator comprises:

a first switching device connected between the first MOS capacitor and a ground terminal and configured to control the current of the second current path; and a second switching device connected between the second MOS capacitor and the ground terminal and configured to control the control current of the first current path in response to the current control voltage.

16. The system as claimed in claim 10, wherein the voltage controller receives a voltage of the node between the first MOS capacitor and the resistor or the frequency control voltage and uses the received voltage as the reference voltage.

* * * * *